(12) United States Patent
Roqan et al.

(10) Patent No.: US 11,862,742 B2
(45) Date of Patent: Jan. 2, 2024

(54) DEEP ULTRA-VIOLET DEVICES USING ULTRA-VIOLET NANOPARTICLES WITH P-TYPE CONDUCTIVITY

(71) Applicant: KING ABDULLAH UNIVERSITY OF SCIENCE AND TECHNOLOGY, Thuwal (SA)

(72) Inventors: Iman S. Roqan, Thuwal (SA); Somak Mitra, Thuwal (SA); Yusin Pak, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 255 days.

(21) Appl. No.: 17/419,456

(22) PCT Filed: Jan. 16, 2020

(86) PCT No.: PCT/IB2020/050348
§ 371 (c)(1),
(2) Date: Jun. 29, 2021

(87) PCT Pub. No.: WO2020/148702
PCT Pub. Date: Jul. 23, 2020

(65) Prior Publication Data
US 2022/0077334 A1  Mar. 10, 2022

Related U.S. Application Data

(60) Provisional application No. 62/793,490, filed on Jan. 17, 2019.

(51) Int. Cl.
*H01L 31/0352* (2006.01)
*H01L 31/109* (2006.01)
(Continued)

(52) U.S. Cl.
CPC .......... *H01L 31/035218* (2013.01); *H01L 31/03048* (2013.01); *H01L 31/035227* (2013.01); *H01L 31/09* (2013.01); *H01L 31/109* (2013.01)

(58) Field of Classification Search
CPC ....... H01L 31/035218; H01L 31/03048; H01L 31/109; H01L 31/035227; H01L 31/09
See application file for complete search history.

(56) References Cited

U.S. PATENT DOCUMENTS 10,418,392 B2 * 9/2019 Yen .................. H01L 27/1463

FOREIGN PATENT DOCUMENTS

WO        2018215893 A1    11/2018
WO    WO-2018215893 A1 *  11/2018 .......... B01J 19/0006

OTHER PUBLICATIONS

Agrawal, J., et al., "Fabrication of High Responsivity Deep UV Photo-Detector Based on Na Doped ZnO Nanocolumns," Journal of Physics D: Applied Physics, Apr. 16, 2018, vol. 51, pp. 1-13, IOP Publishing.
(Continued)

*Primary Examiner* — David Vu
*Assistant Examiner* — Brandon C Fox
(74) *Attorney, Agent, or Firm* — PATENT PORTFOLIO BUILDERS PLLC

(57) ABSTRACT

A photodetector for detecting deep ultra-violet light includes a substrate; first and second electrodes separated by a channel; and colloidal MnO based quantum dots formed in the channel. The colloidal MnO based quantum dots are sensitive to ultra-violet light having a wavelength lower than 300 nm.

20 Claims, 16 Drawing Sheets

(51) Int. Cl.
   *H01L 31/0304* (2006.01)
   *H01L 31/09* (2006.01)

(56) References Cited

OTHER PUBLICATIONS

International Search Report in corresponding/related International Application No. PCT/IB2020/050348, dated Apr. 1, 2020.
Konstantatos, G., et al., "Solution-Processed Quantum Dot Photodetectors," Proceedings of the IEEE, Oct. 2009, vol. 97, No. 10, pp. 1666-1683, IEEE.
Mitra, S., et al., "High-Performance Solar-Blind Flexible Deep-UV Photodetectors Based on Quantum Dots Synthesized by Femtosecond-Laser Ablation," Nano Energy, Jun. 2018, vol. 48, pp. 551-559, Elsevier.
Written Opinion of the International Searching Authority in corresponding/related International Application No. PCT/IB2020/050348, dated Apr. 1, 2020.
Zhang, Q., et al., "Solution-Processed Graphene Quantum Dot Deep-UV Photodetectors," ACS Nano, Jan. 27, 2015, vol. 9, No. 2, pp. 1561-1570, American Chemical Society.

\* cited by examiner

DEEP ULTRA-VIOLET DEVICES USING ULTRA-VIOLET NANOPARTICLES WITH P-TYPE CONDUCTIVITY

CROSS-REFERENCE TO RELATED APPLICATIONS

This application is a U.S. National Stage Application of International Application No. PCT/IB2020/050348, filed on Jan. 16, 2020, which claims priority to U.S. Provisional Patent Application No. 62/793,490, filed on Jan. 17, 2019, entitled "UV NANOPARTICLES WITH HIGHLY STABLE P-TYPE CONDUCTIVITY FOR DEEP UV DEVICES," the disclosures of which are incorporated herein by reference in their entirety.

BACKGROUND

Technical Field

Embodiments of the subject matter disclosed herein generally relate to a deep ultra-violet (DUV) device that uses UV nanoparticles that exhibit a highly stable p-type conductivity.

Discussion of the Background

The modern technology based on electronics, optoelectronics, sensors, bio-devices, and photovoltaic applications requires semiconductor devices including diodes, transistors, and laser diodes which are built based on p-n junctions. Optoelectronic applications based on wide bandgap semiconductors (WBGSs) are of particular interest in many fields. WBGSs that are transparent in the entire spectral range, from UV to infrared (IR), are highly sought after materials, due to their use in a wide range of industrial applications, such as transparent thin-film transistors, solar cells, white lighting, DUV light-emitting diodes for sterilizations, DUV lasers for medical curing, touch display panels, photodetectors for space communication, biological and missile sensors, etc. Most of these applications have not yet been implemented in practice in the DUV range (e.g., UV-C, which includes wavelengths equal to or smaller than 280 nm) as the existing materials need significant optimizations to boost their performance, and also as there is a significant need to produce both p-type and n-type wide bandgap semiconductors with good stability and high conductivity.

Therefore, a sustained effort has been dedicated to improving the existing DUV devices. The main and most challenging obstacle that must be overcome with these devices is the lack of p-type DUV wide bandgap semiconductors. A p-type DUV wide bandgap semiconductor has more holes than electrons, can handle photons having a wavelength equal to or smaller than 280 nm, and has a bandgap equal to or larger than 3.4 eV. The currently available n-type DUV wide bandgap semiconductors, based on ZnO and $Ga_2O_3$, or AlGaN, operate in the UV-A (300-370 nm) and UV-B (280-300 nm) ranges and they show a high-stability when used in corresponding devices.

However, the well-known stable wide bandgap p-type semiconductors, such as GaN and SnO, are limited to the UV-A range only (3.5 eV). Thus, the existing wide bandgap p-type semiconductors are not suitable for the DUV range. Therefore, no stable p-type semiconductor operating in the UV-B and UV-C (>3.4 eV) region is presently known based on the inventors' experience.

There have been many attempts to convert ZnO and $Ga_2O_3$ to p-type or to fabricate p-type contact layers based on p-type Mg-doped AlGaN. However, none were successful, as these materials did not show very good stability, or they drastically reduced the device's efficiency. Hence, absence of p-type semiconductors hinders the fabrication of the UV or DUV optoelectronic devices in the UV-B and UV-C ranges.

An issue that needs to be overcome for the existing p-type wide bandgap semiconductor is (1) the lack of conductive p-type DUV WBGS operating in the DUV range <300 nm (>4.1 eV) with good p-type stability, and (2) the complex WBGS fabrication process that requires expensive and high vacuum-based technologies.

Thus, although GaN, $Cu_2O$, and SnO are well-known p-type WBGSs, they are inapplicable to the DUV range, as their bandgaps are limited to UV devices operating in the UV-A to visible range (>300 nm). Moreover, even though the currently available n-type WBGSs, such as ZnO, $Ga_2O_3$, and AlGaN, operating in the UV and DUV (280-390 nm) ranges show high stability, due to their intrinsic properties, it is not possible to convert them to a p-type material with a good stability and conductivity. The challenge in obtaining the p-type ZnO mainly stems from the very-deep acceptor levels resulting in the unstable p-type conductivity, which degrades after a short growth time due to the formation of compensating states resulted from the high-density of the donor impurities. Given that the p-type $Ga_2O_3$ is unattainable, the only remaining p-type impurity is Mg, which leads to significant resistivity without producing any acceptors levels. In addition, p-type AlGaN doped with Mg, recognized as the UV contact layer candidate that can be used in the emitting devices, has so far failed to show suitable p-type conductivity, as Mg significantly increases the resistivity due to large acceptor activation energy (500-600 meV).

Therefore, no highly stable p-type DUV WBGS operating in both UV-B and UV-C region presently exists. Moreover, to be suitable for all DUV-based technology applications, such material needs to be free from other issues, such as lattice mismatch layer, and high-cost and fabrication complexity.

Thus, there is a need for a novel material with stable p-type conductivity and low resistivity, which can be used to make a stable p-type DUV WBGS operating in both the UV-B and UV-C regions.

BRIEF SUMMARY OF THE INVENTION

According to an embodiment, there is a photodetector for detecting deep ultra-violet light, and the photodetector includes a substrate, first and second electrodes separated by a channel, and colloidal MnO based quantum dots formed in the channel. The colloidal MnO based quantum dots are sensitive to ultra-violet light having a wavelength lower than 300 nm.

According to another embodiment, there is an optoelectronic device that operates under deep ultra-violet conditions. The optoelectronic device includes a substrate, first and second electrodes separated by a channel, and a heterojunction formed in the channel, between the first and second electrodes. The heterojunction includes a p-type colloidal MnO based quantum dots and an n-type material based layer.

According to yet another embodiment, there is an optoelectronic device that operates under deep ultra-violet conditions. The optoelectronic device includes a substrate, plural nanowires attached with one end to the substrate, plural p-type colloidal MnO based quantum dots formed on the plural nanowires, and first and second electrodes.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

The following description of the embodiments refers to the accompanying drawings. The same reference numbers in different drawings identify the same or similar elements. The following detailed description does not limit the invention. Instead, the scope of the invention is defined by the appended claims. For simplicity, most of the embodiments discussed herein disclose colloidal MnO-based quantum dots (or nanostructures) that are used in a photodetector as an example that these quantum dots can be applicable for devices. However, many other devices may take advantage of these quantum dots (nanostructures), as for example, transistors, diodes, spin transistor, etc.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

According to an embodiment, a WBGS-based p-n junction DUV device is introduced that uses p-type manganese oxide WBGS quantum dots (MnO QDs) (or nanostructure). Highly crystalline MnO QDs may be synthesized via a femtosecond-laser ablation method in liquid and their p-type stability is demonstrated by Kelvin probe and field effect transistor measurements. In one application, the composition of the p-type WBGS MnO QDs is 81.5% MnO, 12.0% MnOOH, and 6.5% $Mn_2O_3$. However, variations of these numbers in a range of +/−15%, as discussed later, still achieve the properties noted above. Self-powered and solar-blind photodetectors capable of detecting DUV wavelengths below 300 nm under ambient conditions, based on the novel MnO QDs, confirm the carrier (hole) generation and UV transparency. This novel material is now discussed in more detail.

Figure 1:
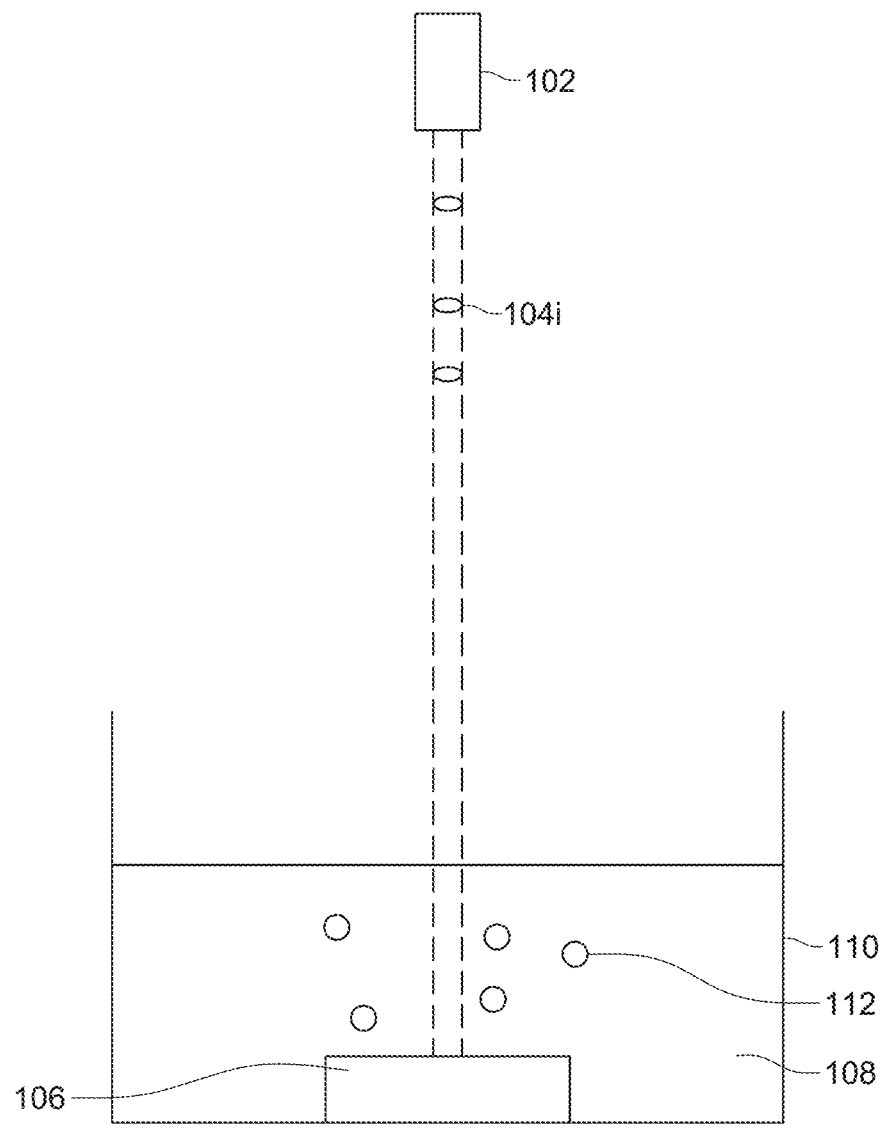
FIG. 1 is a schematic diagram of a system for making nanoparticles.

The MnO QDs may be manufactured based on a femtosecond laser ablation in liquid (FLAL) method as developed by the present inventors [1] and [2]. The FLAL method uses ultrashort laser pulses that can be performed in atmospheric conditions. In one application, a titanium-sapphire femtosecond (fs) laser device 102, as shown in FIG. 1, sends a plurality of laser beam pulses 104$i$ to a target 106 provided in a liquid 108. The laser device 102 may be used with operating conditions of 150 fs pulse width and 76 MHz pulse repetition rate at 800 nm wavelength. The laser beam pulses 104$i$ are directed to the target 106, which is submerged in the solvent 108, which is contained in a vessel 110. The target 106 may be a manganese oxide material. As this technique is free from ablation damage to the manganese oxide target, it would be minimizing the formation of undesired components consisting of complex stoichiometric compositions (e.g., $Mn_xO_{1-x}$) during the fabrication process.

Figure 2A:
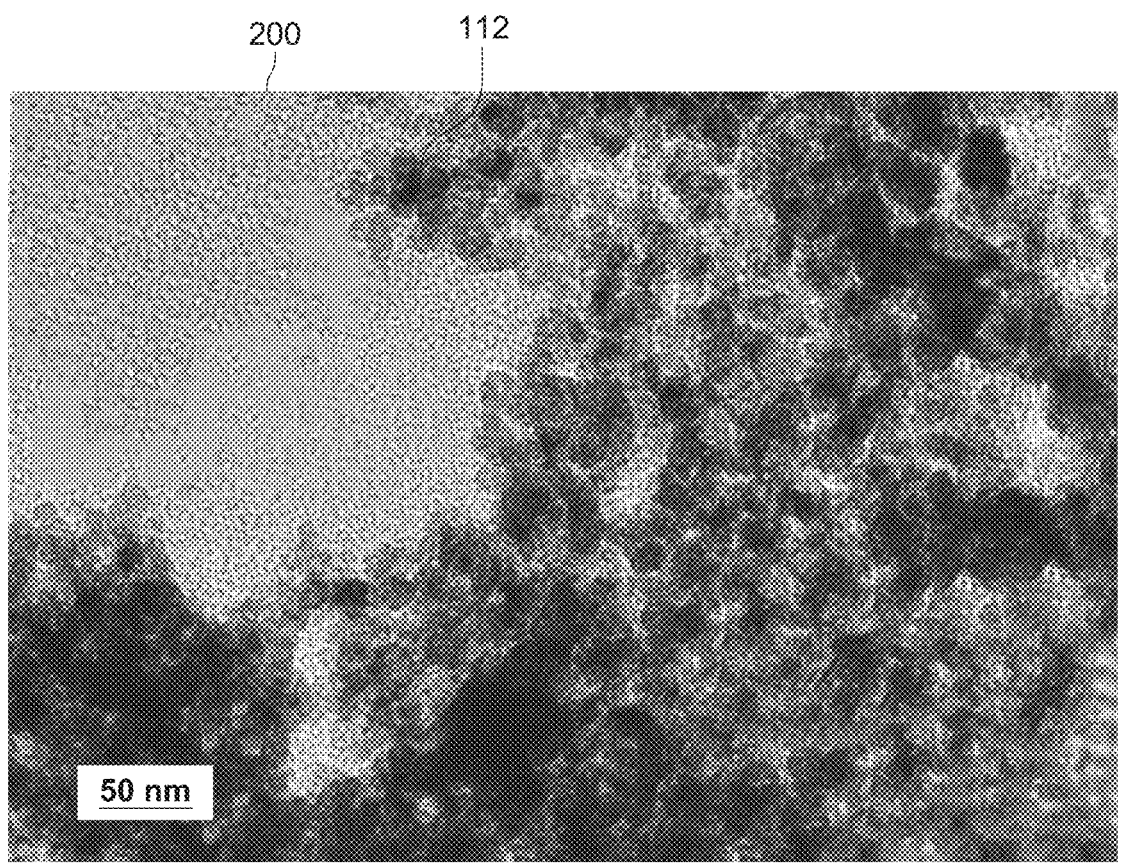
FIGS. 2A to 2C illustrate MnO quantum dots formed with the system of FIG. 1.
Figure 2B:
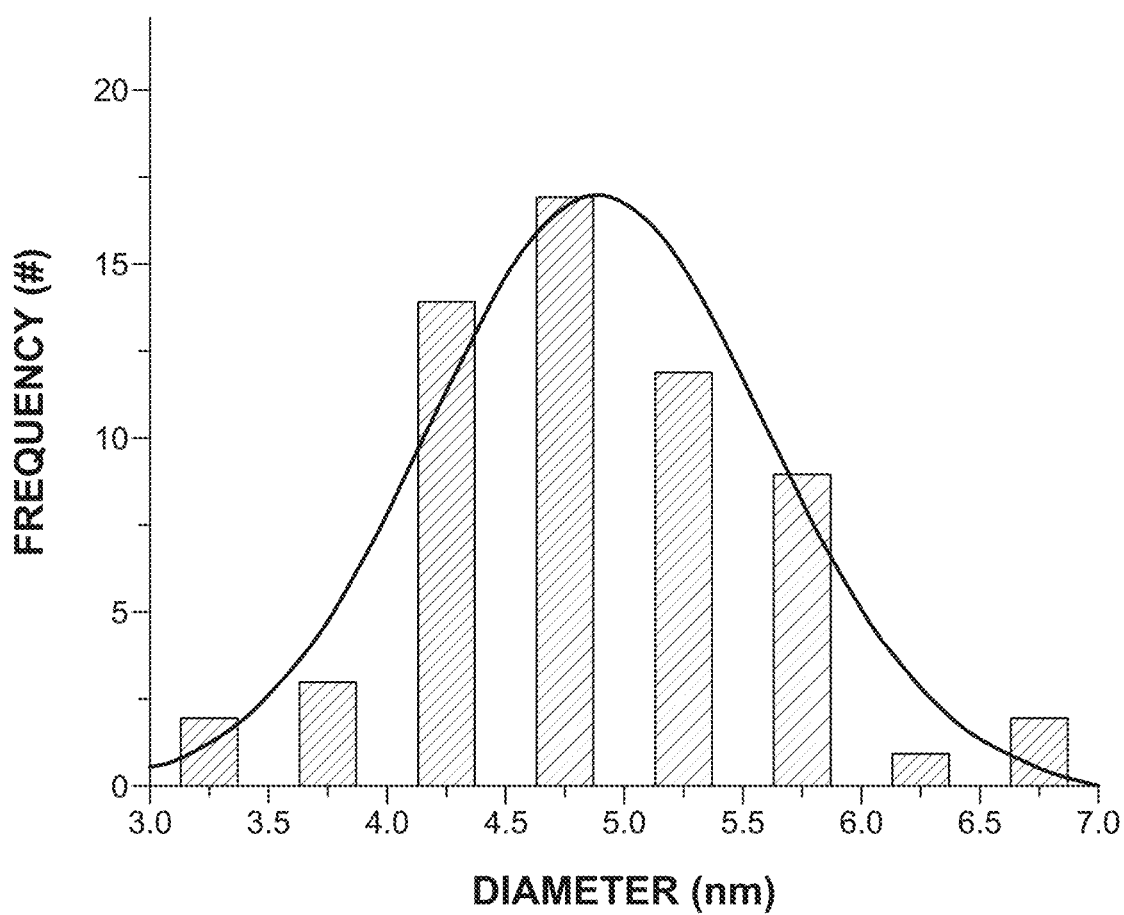
Figure 2C:
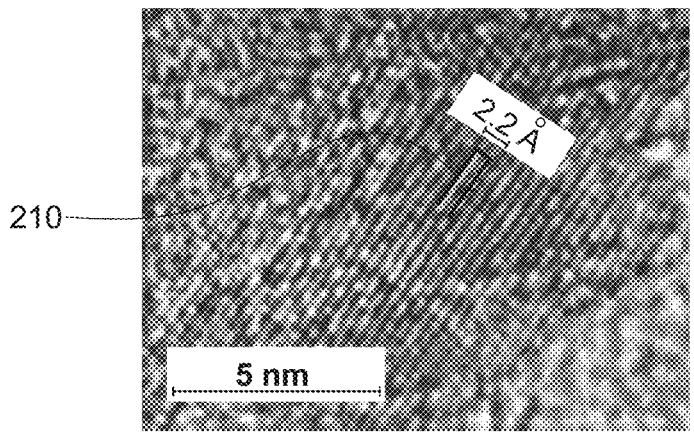

Interaction of the laser beam pulses 104$i$ with the target 106 expels nanosized chunks of material from the target 106, and these chunks of material form the desired MnO nanoparticles 112, also called colloidal MnO based quantum dots (MnO QDs). High-resolution transmission electron microscopy (HR-TEM) measurements were performed to examine the structural properties of the FLAL-synthesized colloidal MnO QDs 112. Electron energy-loss spectroscopy (EELS) by the TEM system was conducted to confirm the material composition. FIGS. 2A-2C illustrate the crystallographic and dimensional properties of the MnO QDs synthesized via the FLAL technique. More specifically, FIG. 2A shows the MnO QDs 112 on a TEM grid 200, whereby a mean diameter of the MnO QDs was calculated to be 4.8±0.2 nm, as indicated by the distribution graph presented in FIG. 2B. Note that a MnO QD is considered herein to have a diameter of 10 nm or less and FIG. 2B shows that all the MnO QD are less than 10 nm. The HR-TEM image shown in FIG. 2C demonstrates the atomic distribution of the MnO QDs 112 with good crystallinity. The inter-planar spacing 210 was measured to be about 2.22 Å, which is a good match to the inter-plannar spacing of (200) and (111) planes of MnO. The atomic compositions were confirmed by electron energy loss spectroscopy (EELS) mapping. The EELS shown the presence of Mn, O, and C atoms, confirming that the Mn and O atoms are homogeneously distributed within a single MnO QD 112. Similar evidence for the presence of both Mn and O atoms in the structure was provided by energy-dispersive X-ray (EDX) spectroscopy measurements.

Figure 3A:
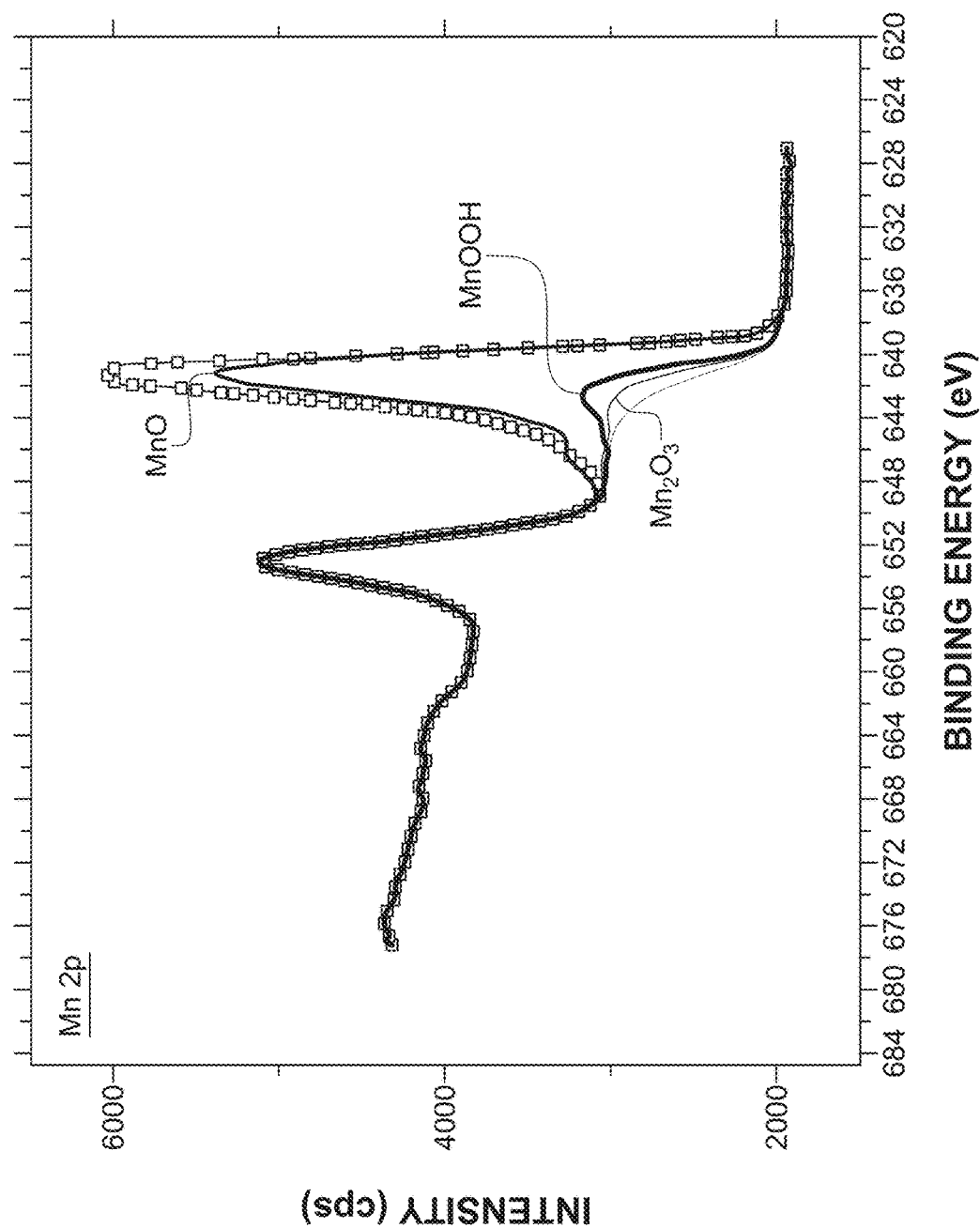
FIG. 3A illustrates the X-ray photoelectron spectroscopy (XPS) spectra of the Mn 2p core level from MnO quantum dots.
Figure 3B:
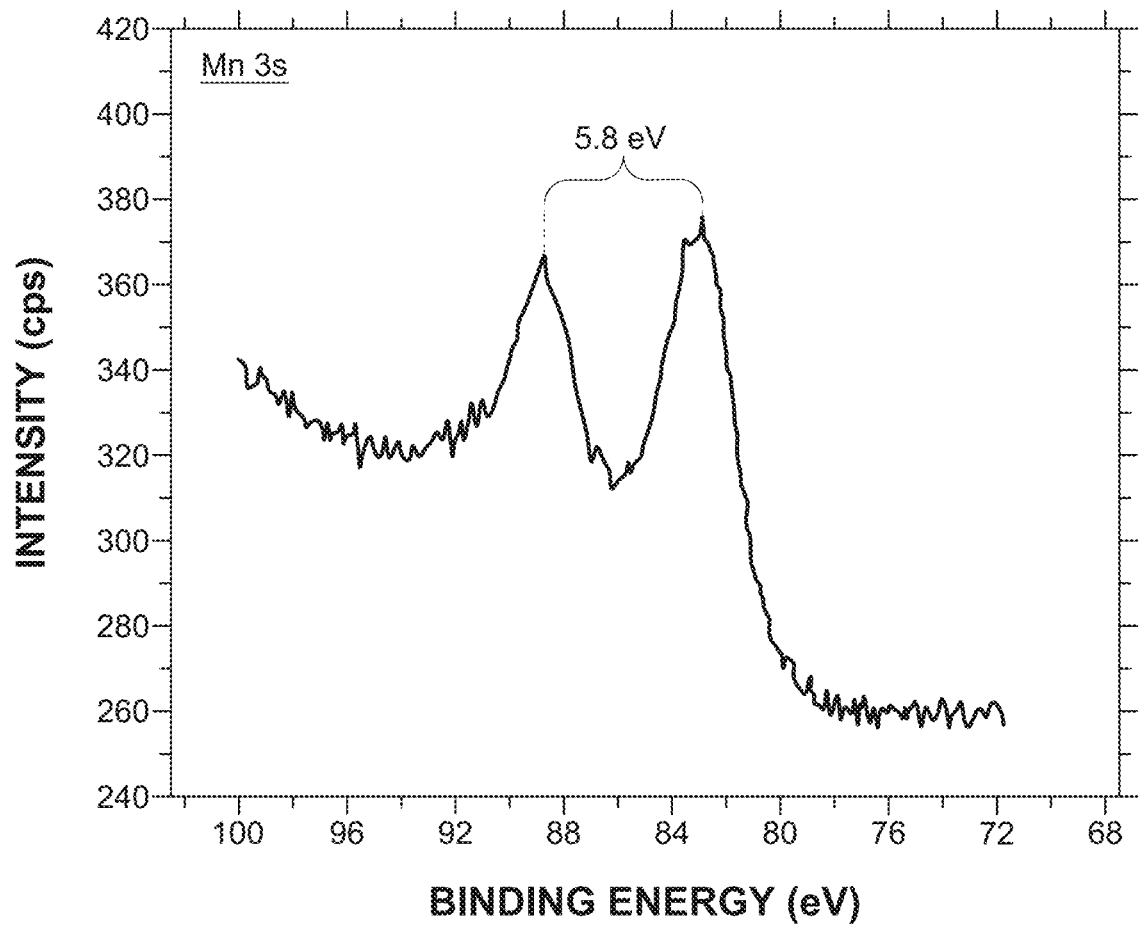
FIG. 3B illustrates the Mn 3s multiple splitting energy.
Figure 4:
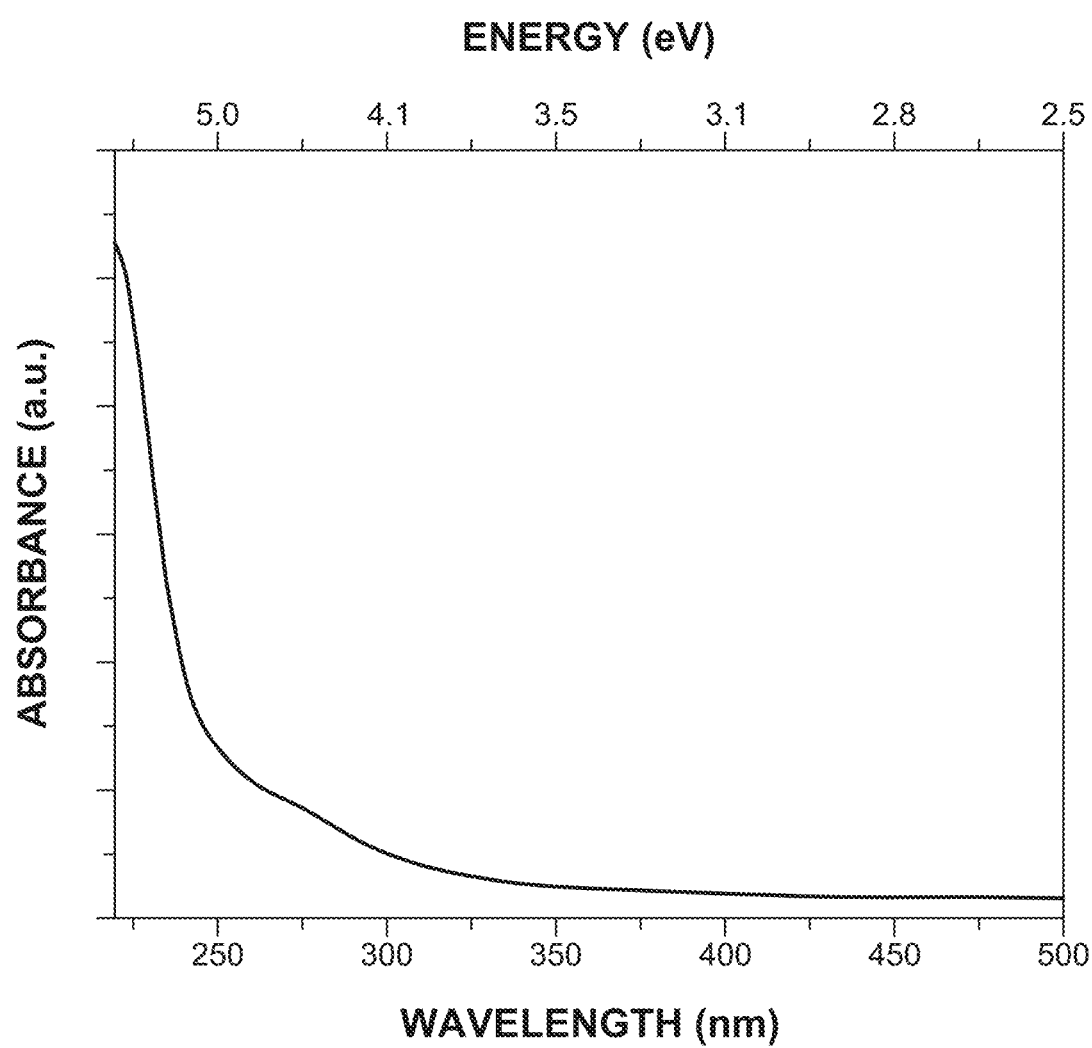
FIG. 4 illustrates the absorption spectra of the colloidal MnO quantum dots in ethanol.

FIG. 3A shows the XPS spectra of the Mn 2p core level from MnO QDs, indicating that the MnO QDs are mostly in the MnO phase, with a small contribution of MnOOH (MnO QDs having —OH termination) and $Mn_2O_3$ phases. FIG. 3B shows that the Mn 3s multiple splitting is 5.8 eV, which is very close to the value pertaining to the MnO. The inventors believe that this unique and novel mix composition of MnO, $Mn_2O_3$ and MnO phase passivated by OH is the reason of the unique electrical and optical characteristic of the MnO QDs. For simplicity, herein, this novel material that includes quantum dots having a chemical composition of 85% or less of MnO, between 10 and 15% $MnO_2H$, and less than 10% $Mn_2O_3$ is called the colloidal MnO QDs. The name colloidal MnO QDs is used herein interchangeably with the term MnO QDs. Such compound has been found to have a bandgap that exceeds 4.1 ev in the DUV range, as illustrated in FIG. 4, which shows the absorption spectra of the colloidal MnO QDs in ethanol versus the wavelength and the energy.

The p-type nature of the MnO QDs manufactured as discussed above is now explored by using the Kelvin probe measurement (KPSs) and the field effect transistor (FET) measurements. KPMs are typically conducted to determine the Fermi level position for a particular material, which is represented by its work function. In preparation for the KPM, colloidal MnO QDs solution was spray-coated on a gold-plated glass, which was placed on a KPM stage inside a Faraday cage in which the measurements were carried out. When performing KPM, a vibrating metal tip (gold tip) is placed in the vicinity of the sample surface. An electron flow is maintained until the Fermi level is aligned between the two materials. This results in a potential buildup that can be nullified by an external feedback loop. Before carrying out the KPM scanning measurements on the MnO QDs sample, the system was calibrated using a pure gold-plated sample. Based on the repeated scans of a 100 µm$^2$ area, the average work function was found to be 4.87±0.02 eV, which is consistent with a p-type material.

Figure 5:
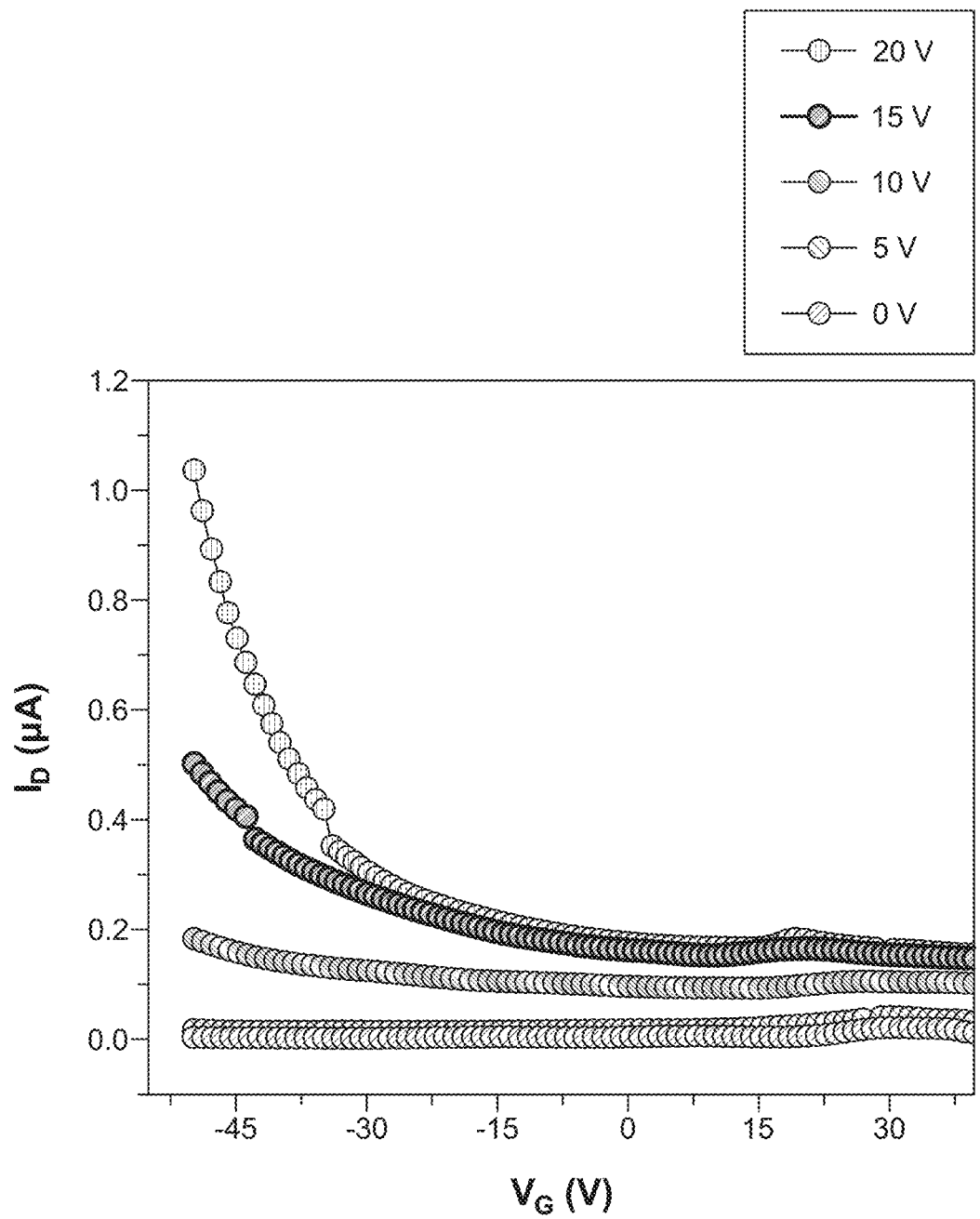
FIG. 5 illustrates the source-drain transfer characteristic plotted as a function of the gate voltage for a given device.

To estimate the electrical properties of the synthesized colloidal MnO QDs, an interdigitated electrode (IDE) for a top contact was constructed on a 200 nm thick silicon dioxide (p-type $SiO_2$) substrate using a shadow mask. Then, the MnO QDs were spray-coated onto the IDE/$SiO_2$ substrate using a $N_2$ blowing gun. An FET based on the coated MnO QDs film (which is illustrated later in FIG. 7B) exhibited the p-type electrical characteristics due to the holes being the majority carriers, as shown in FIG. 5, where the source-drain transfer characteristic is plotted as a function of the gate voltage. However, a high source-drain voltage (>10 V) was used to activate a hole conducting channel due to a large channel length of 50 µm and the porous morphology of the MnO QDs film. Then, the accumulation of hole carriers properly occurred in the range of the negative gate voltage.

Having confirmed that the novel colloidal MnO QDs discussed above exhibit p-type conduction, the photo-carrier generation of such material under DUV illumination is investigated, followed by the description of various optoelectronic devices that are built based on such material.

Figure 6A:
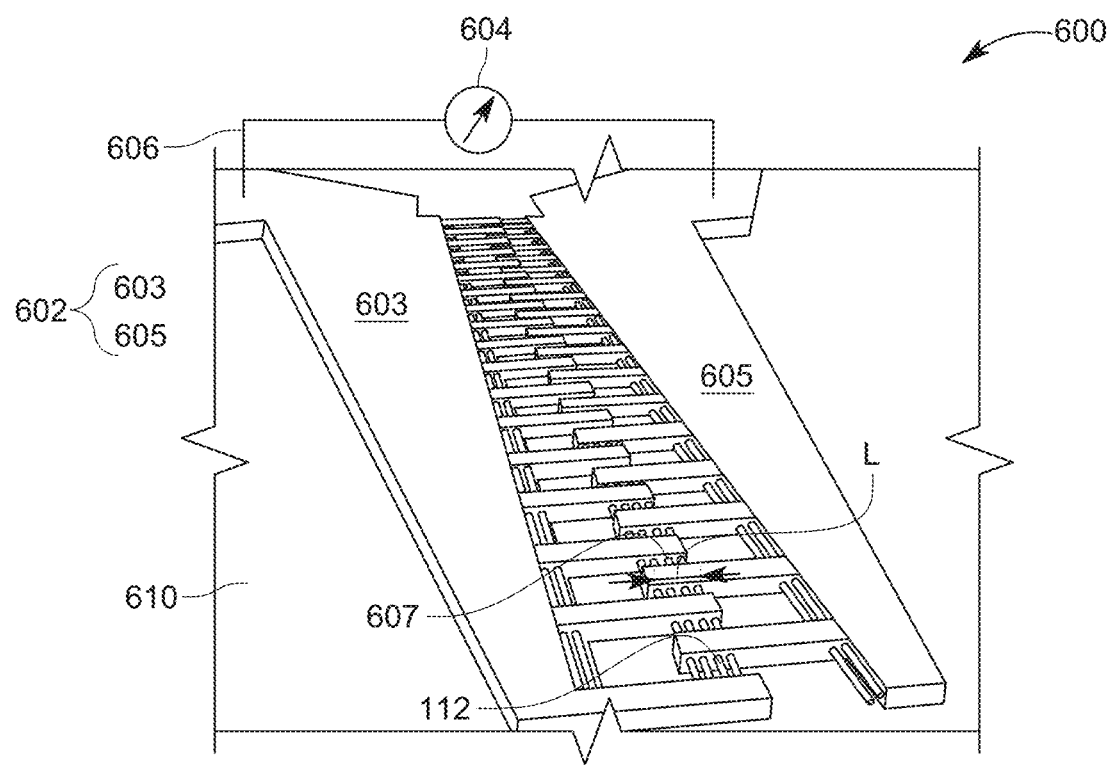
FIGS. 6A to 6E illustrate a photodetector using the colloidal MnO quantum dots and various characteristics of the photodetector.
Figure 6B:
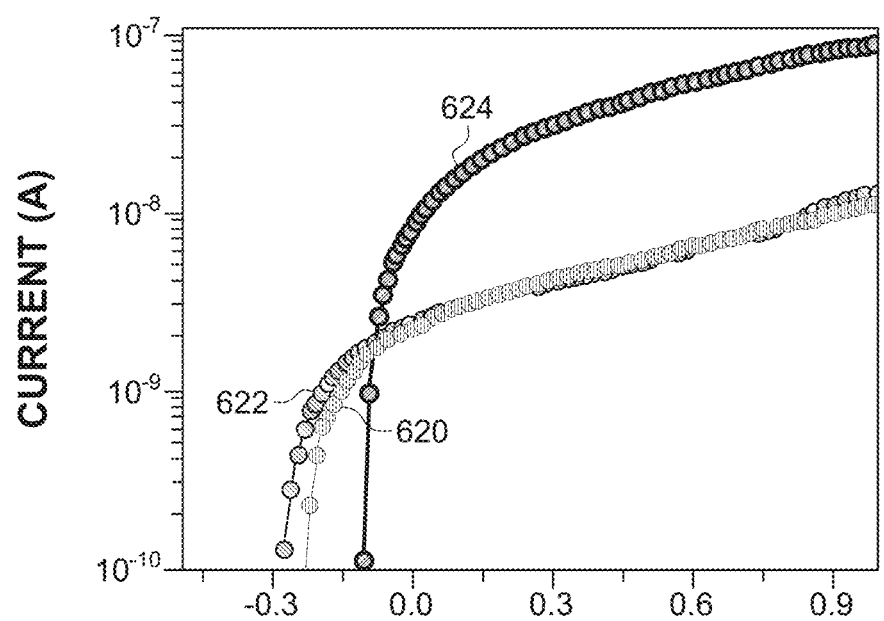
Figure 6C:
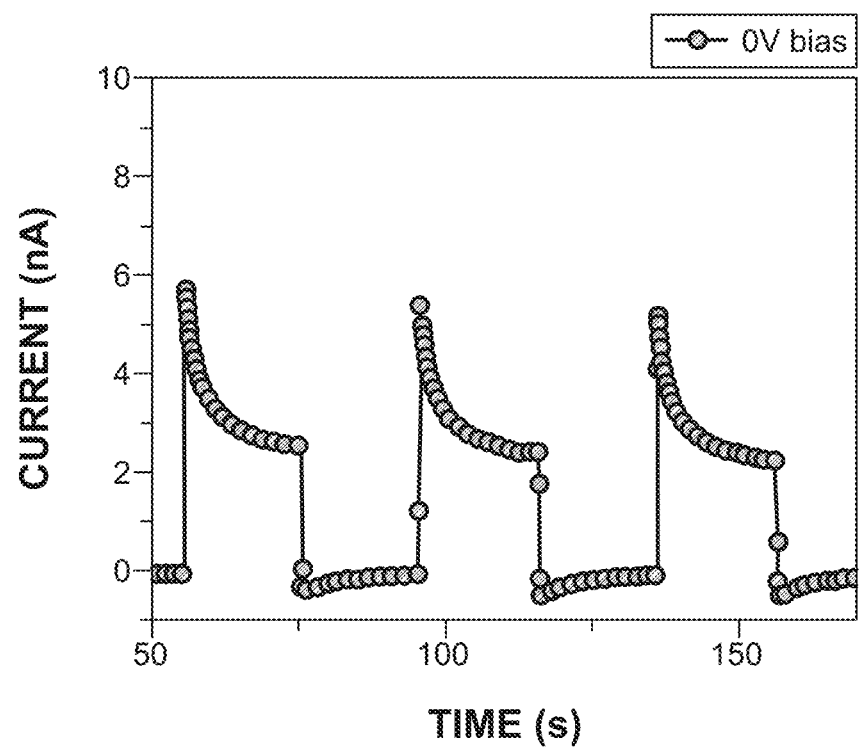
Figure 6D:
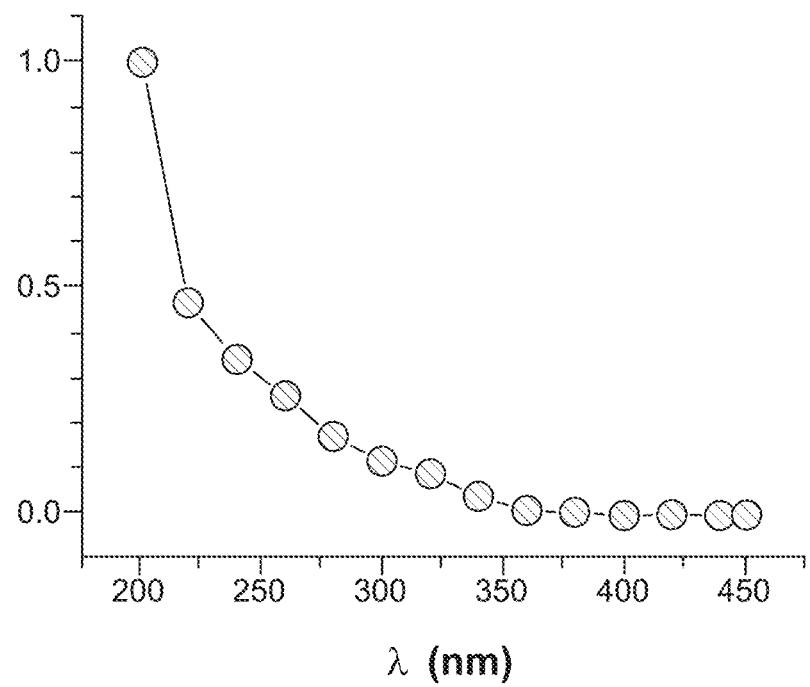
Figure 6E:
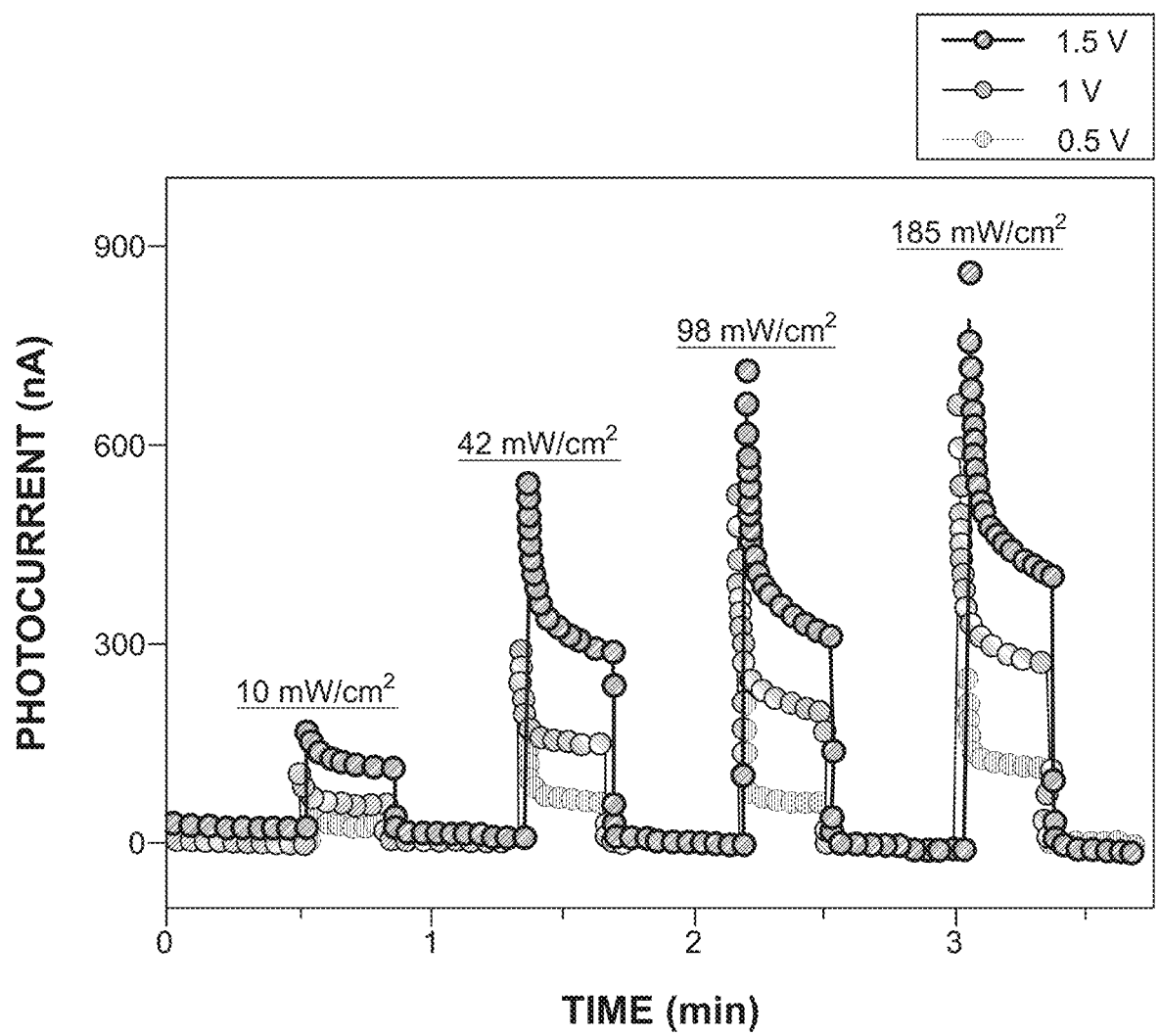

For the photo-carrier generation of the p-type colloidal MnO QDs under DUV illumination, the colloidal p-type MnO QDs 112 were spray-coated at a constant temperature and stable nitrogen gas flow on a (Ti—Ti) IDE 602 having a 30 µm channel length L, as shown in FIG. 6A. The IDE 602 includes a first set of electrodes 603 and a second set of electrodes 605 separated by the channel 607. FIG. 6B shows the dark photocurrent 620, the photocurrent 622 when the laser is off, and the photocurrent 624 when the laser is on under DUV illumination. For this experiment, a 244 nm laser emission was used and the current-voltage (I-V) relationship was established based on a source meter 604 measurements. It is noted that, when the photodetector 600 was fabricated with the asymmetric IDE configuration (Ti—Au), a photocurrent was produced even at 0V bias, as shown in FIG. 6C, indicating that this device can work as a self-powered device. In the dark state 620, the MnO QDs based device exhibits the Ohmic-like current (e.g., 3 nA at 0.1 V), although a small variation in the voltage of the electrically open state was noted owing to the randomly sprayed MnO QDs between the IDEs, as shown in FIG. 6A. The relative responsivity of the photodetector device versus the wavelength of the incident light is plotted in FIG. 6D and it shows a very high responsivity in the DUV range. FIG. 6E shows the transient UV detection behavior of the MnO QDs device under various power densities (10, 42, 98, and 185 mW/cm2) when illuminated by the 244 nm laser.

To achieve a high-quality DUV photodetector, the absorption and photo-response in the visible and UV-A range need to be negligibly small or limited, which is typically denoted as a "solar blind" device, which is typical for space communications and missile sensors. Therefore, the wavelength-dependent photo-response of the photodetector 600 was measured to demonstrate its solar blind nature, which resulted in the relative responsivities depending on the exposed wavelength of light, as shown in FIG. 6D. The figure shows that the relative responsivity is very high in the 200-250 nm range, declining rapidly at wavelengths above 300 nm (UV-A) to reach 0, demonstrating the solar blind characteristics of the novel material. Therefore, the rejection ratio compared to the UV-A range is very high and it is even higher when compared to the visible spectrum.

High-performance DUV photodetectors should have a very low-base current and a high photocurrent, which is shown by the transient photo-response under different illumination power densities in FIG. 6E. The voltage applied during these measurements never exceeded 2 V. The graph in FIG. 6E indicates that throughout the experiment, the base current remained extremely low (<50 nA), whereas a high photocurrent generation was observed even at 0.5 V applied bias. At the same time, this device is capable of detecting a very low illumination (10 mW/cm$^2$ at 244 nm).

Another photodetector 700 is now discussed with regard to FIGS. 7A to 7E. The photodetector 700 is based on a heterojunction formed by coating p-type MnO QDs onto a 2D-$MoS_2$ layer (or any 2D material) as now discussed. A photodetector based on 2D materials coated by MnO QDs are characterized by a significantly lower dark current and increased photocurrent compared to that uncoated pristine 2D materials. The contact between (1) the MnO QDs as a p-type material (with holes as the majority carriers) and (2) the 2D-$MoS_2$ as an n-type material (whereby electrons are the majority carriers) creates a heterojunction, theoretically resulting in a charge transfer at the interface between the two materials due to the difference in their work functions.

Figure 7A:
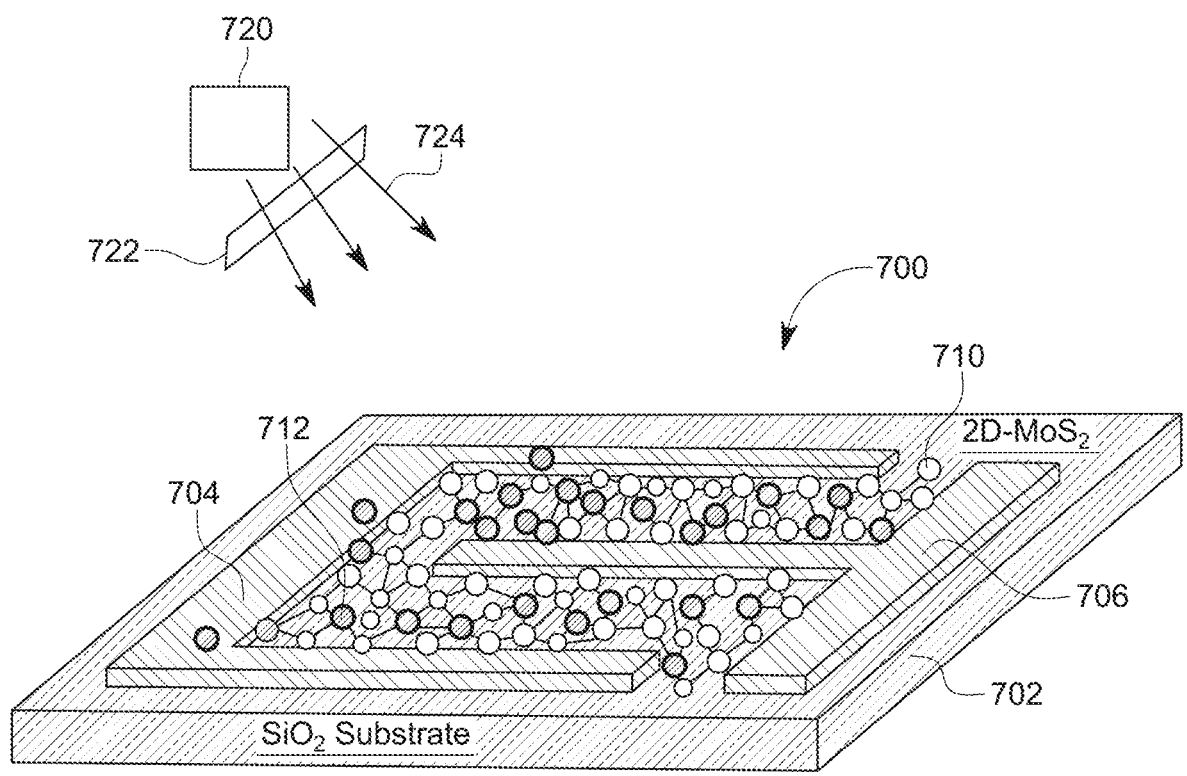
FIGS. 7A to 7E illustrate an optoelectronic device using the colloidal MnO quantum dots and various characteristics of the device.
Figure 7B:
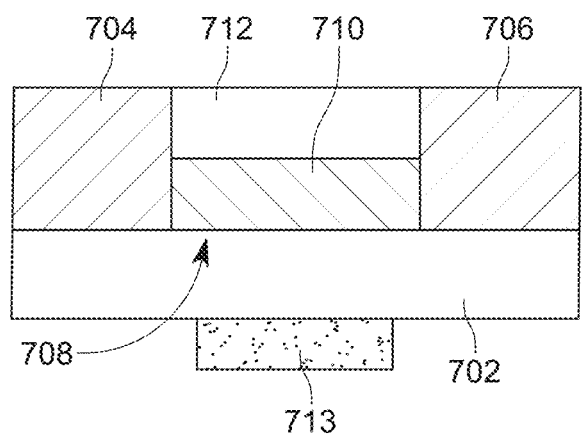

FIG. 7A shows the schematic of the heterojunction MnO QDs-$MoS_2$ based photodetector 700 having interdigited electrodes 704 and 706 formed on a substrate 702, which can be $SiO_2$. The electrodes can be made of Au or Ti, or a combination of these materials. The 2D-$MoS_2$ layer 710 may be transferred onto the 200 nm thick silicon dioxide ($SiO_2$)/Si (a heavily doped p-type) substrate 702 using a taping method. The MnO QDs 712 are placed directly onto the 2D-$MoS_2$ layer 710. The 2D-$MoS_2$ layer 710 coated with the MnO QDs 712 is placed in a channel 708 defined by the electrodes 704 and 706, as illustrated in FIG. 7B. The electrical contact between the electrodes and the MnO QDs coated $MoS_2$ 2D layer was established via 100 nm thick Au interdigitated electrodes, and the channel 708 has a channel length and width of 5 µm and 640 µm, respectively. A cross-section through the MnO QDs-$MoS_2$ photodetector 700 is shown in FIG. 7B. In one application, a third electrode 713 can be added to the back of the substrate 702, to face the MnO QDs-$MoS_2$ layers 710 and 712, and this electrode can be used as a gate, so that the entire device 700 becomes a transistor. In one embodiment, the transistor may be an optical transistor, where the properties of the gate are modified by DUV illumination so that an electron or hole flow is controlled.

Figure 7C:
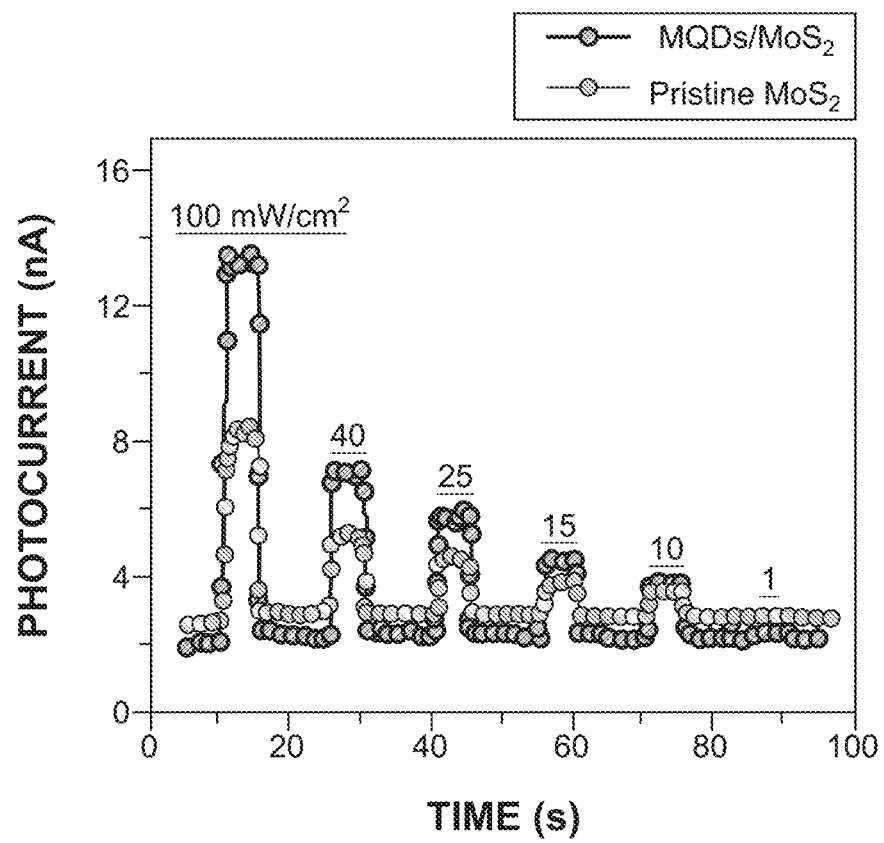

The dynamic photo-responses of both the bare $MoS_2$ photodetector (not shown) and the MnO QDs-$MoS_2$ heterojunction based photodetector 700 upon illumination cycles of 5 s ON and 10 s OFF are shown in FIG. 7C. At 0.2 V, both devices were exposed to light 724 having different power density Pden values (100, 40, 25, 15, 10, and 1 mW/cm$^2$), which were modulated using neutral-density (ND) filters 722 placed beneath the output window of the solar simulator 720. As the Pden increased, the MnO QDs-$MoS_2$ photodetector 700 produced higher photocurrents compared to the bare $MoS_2$ photodetector due to the heterojunction 710/712, as shown in FIG. 7C.

Figure 7D:
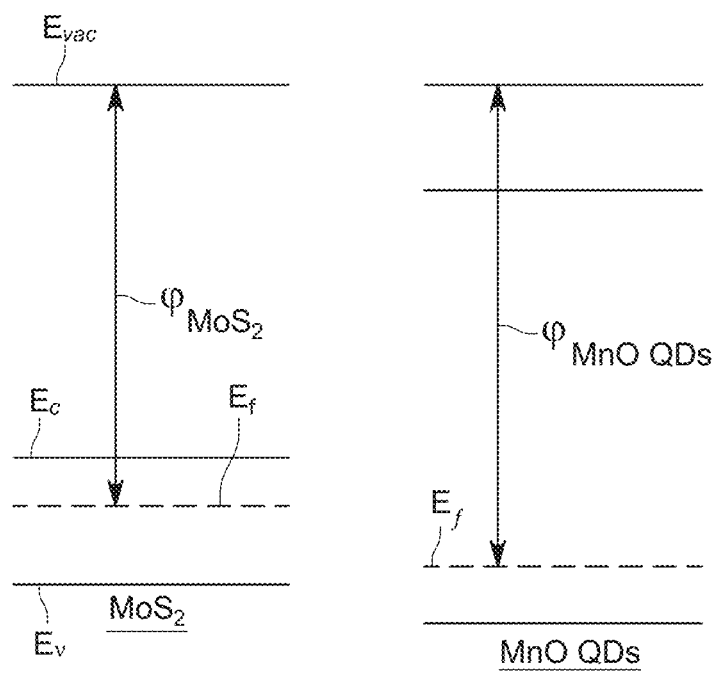
Figure 7E:
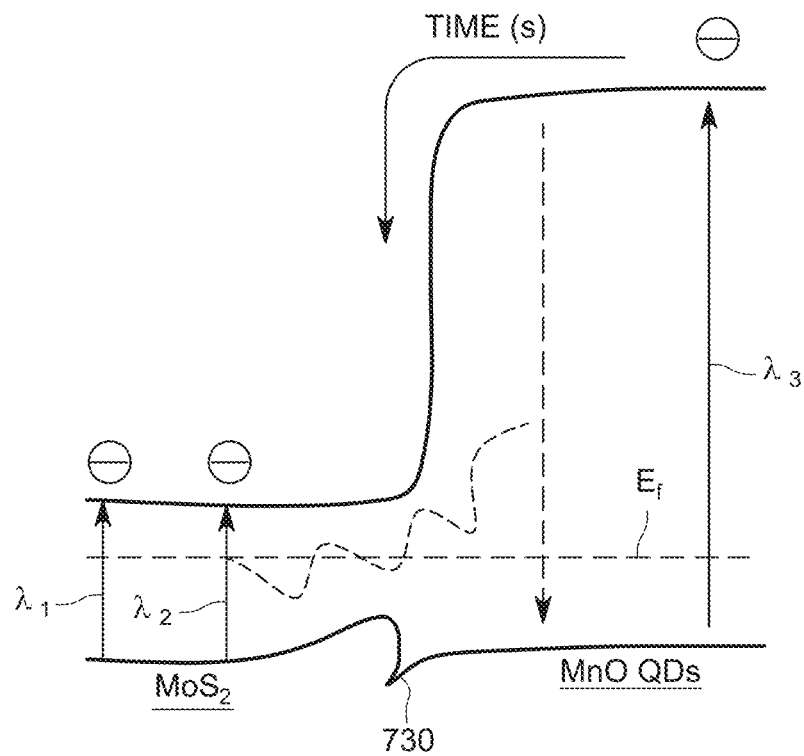

When the two materials MnO QDs and $MoS_2$ are merged as schematically depicted in FIGS. 7D and 7E, their respective Fermi energies $E_f$ are aligned, whereby the electrons in the $MoS_2$ material are transferred to the MnO QDs, decreasing the electron conductivity. As the valence band (VB) of the MnO QDs has an energy below the VB of the $MoS_2$, accordingly a cusp discontinuity 730 can be created at the VB interface. Under illumination, three absorption paths (denoted as $\lambda 1$, $\lambda 2$, and $\lambda 3$) can be activated to generate the electron-hole pairs. The paths indicated by $\lambda 1$ and $\lambda 2$ are the main photogeneration paths corresponding to intrinsic bandgap energies of $MoS_2$ and MnO QDs, respectively. Here, two preconditions are assumed: (i) multiple and complex absorption processes theoretically occurring in such a multi-layered $MoS_2$ can be described simply by $\lambda 1$; and (ii) the MnO QDs dispersed on the $MoS_2$ surface form a complete film with electrical paths. The frequency of photogeneration through the $\lambda 2$ path is high enough due to a sufficient hole density around the VB of the MnO QDs material. Then, the photogenerated electrons in the conduction band (CB) of the MnO QDs material can be favorably supplied into the $MoS_2$ material owing to the high-potential difference, increasing the electron density in the CB of the $MoS_2$ material.

However, another absorption path, denoted as $\lambda 3$, can be established, as shown in FIG. 7E, because the recombination process is prone to occur around the VB cusp with many trap sites. Based on the band diagram shown in FIG. 7E, as well as the spectroscopic data, it is believed that this heterojunction contributes to the dark current decrement, while increasing the photocurrent of the MnO QDs-$MoS_2$ devices.

Figure 8A:
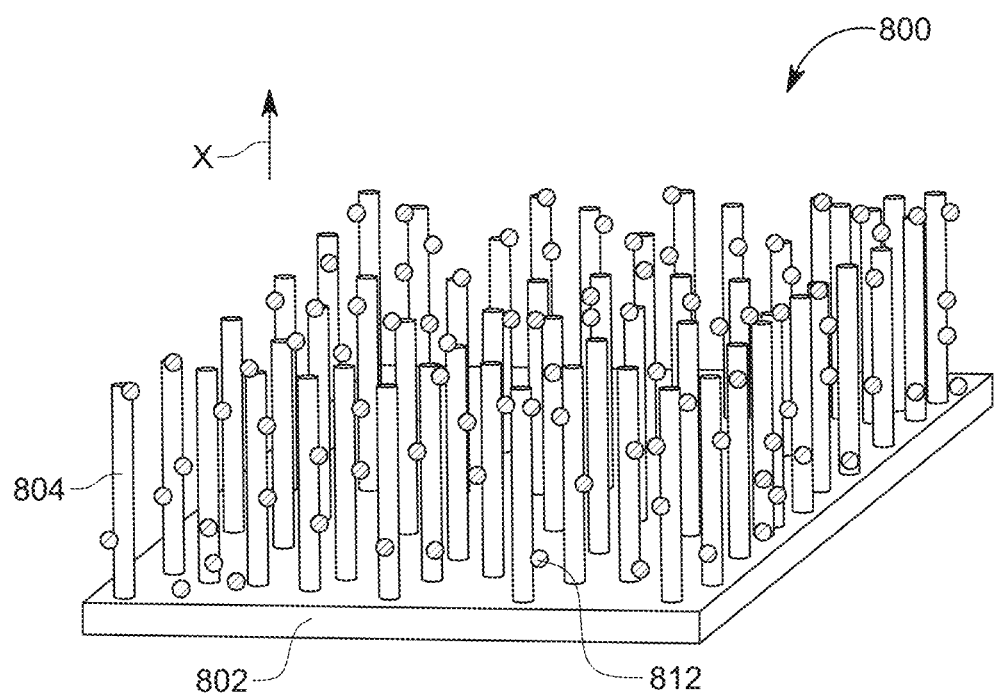
FIGS. 8A to 8B illustrate another photodetector using the colloidal MnO quantum dots spread over nanowires and various characteristics of the photodetector.
Figure 8B:
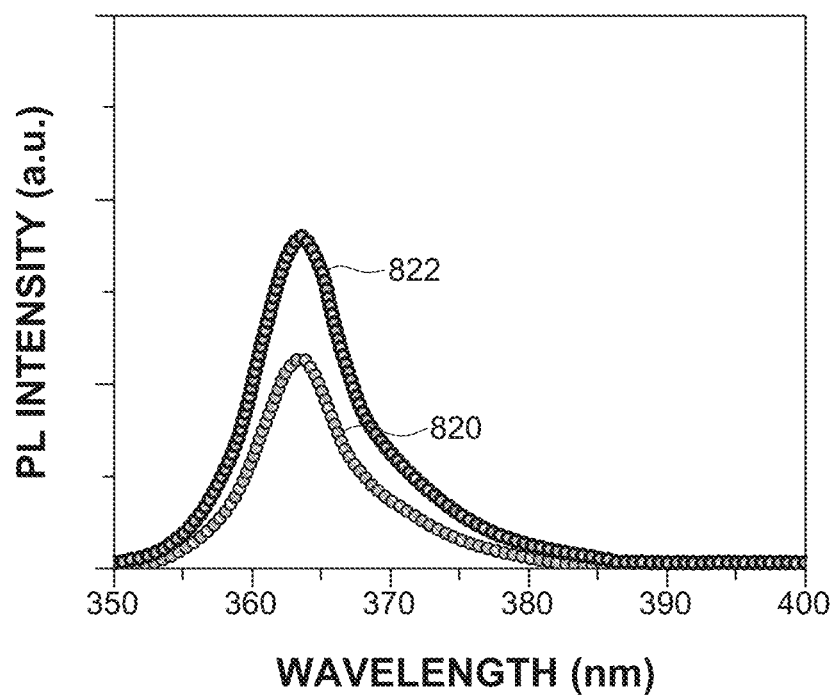

Another photodetector is now discussed with regard to FIGS. 8A to 9C. FIG. 8A shows a device 800 that has a substrate (e.g., $SiO_2$ substrate) 802 on which plural nanowires 804 were grown. The nanowires 804 extend along an axis X, which is perpendicular to the plane of the substrate 802. The nanowires may be made of any known material and they may be grown by the MBE technique. However, in this embodiment, the nanowires (NW) are made of GaN. The colloidal MnO QDs material was drop-casted on the GaN NWs 804 to form MnO QDs 812, which are randomly attached to the GaN NWs 804, as shown in FIG. 8A. The inventors have found that the emission of the GaN NWs 804 is significantly enhanced after drop-casting the MnO QDs 812. These experiments were carried out repeatedly, yielding similar results, i.e., the photoluminescence spectrum 820 of the GaN NWs without the MnO QDs 812 is much smaller than the photoluminescence spectrum 822 of the GaN NWs 804 with the MnO QDs 812. This enhancement can be due to the hole carriers injected to the GaN, increasing the electron-hole recombination events. This process can increase the carrier density that recombined, resulting in a greater radiative recombination rate.

Figure 9A:
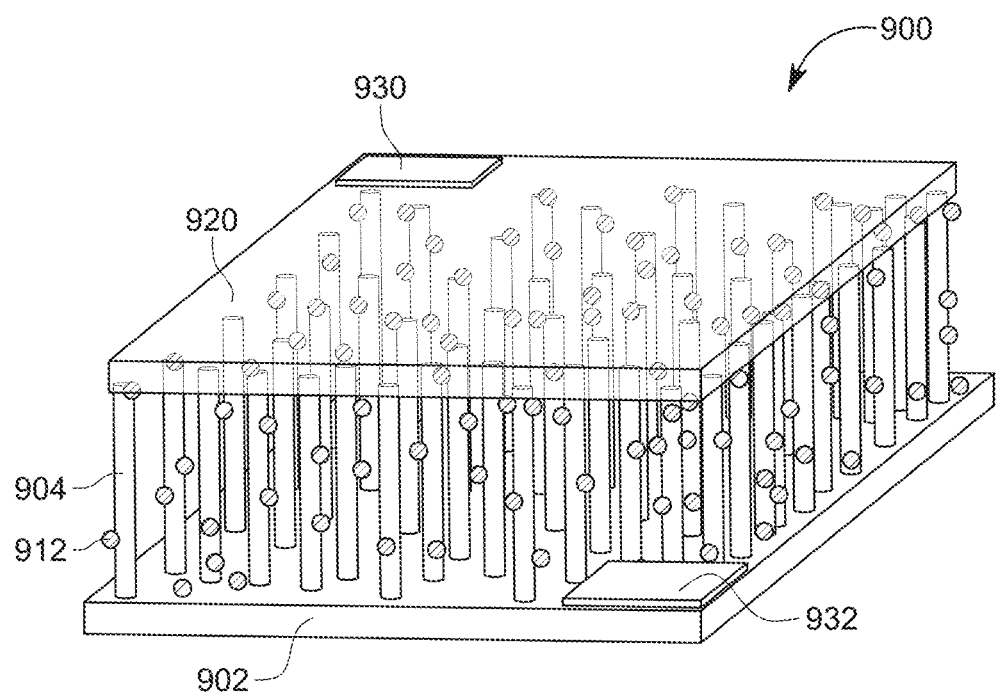
FIGS. 9A to 9C illustrate another optoelectronic device using the colloidal MnO quantum dots spread over plural nanowires.
Figure 9B:
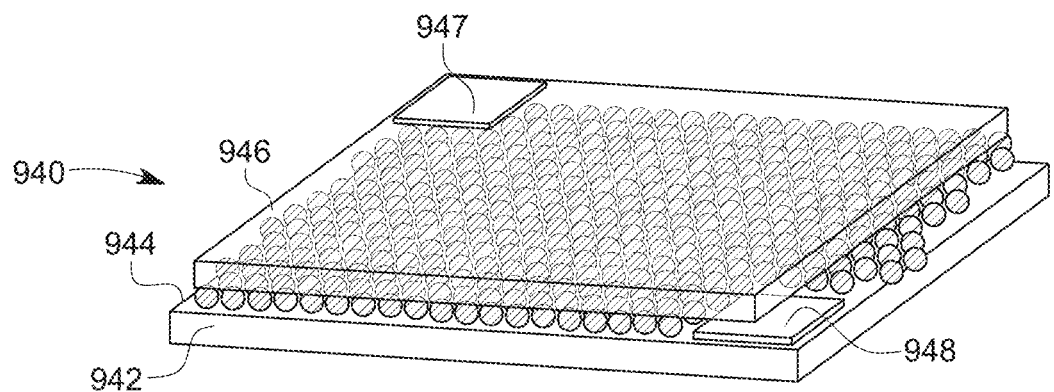
Figure 9C:
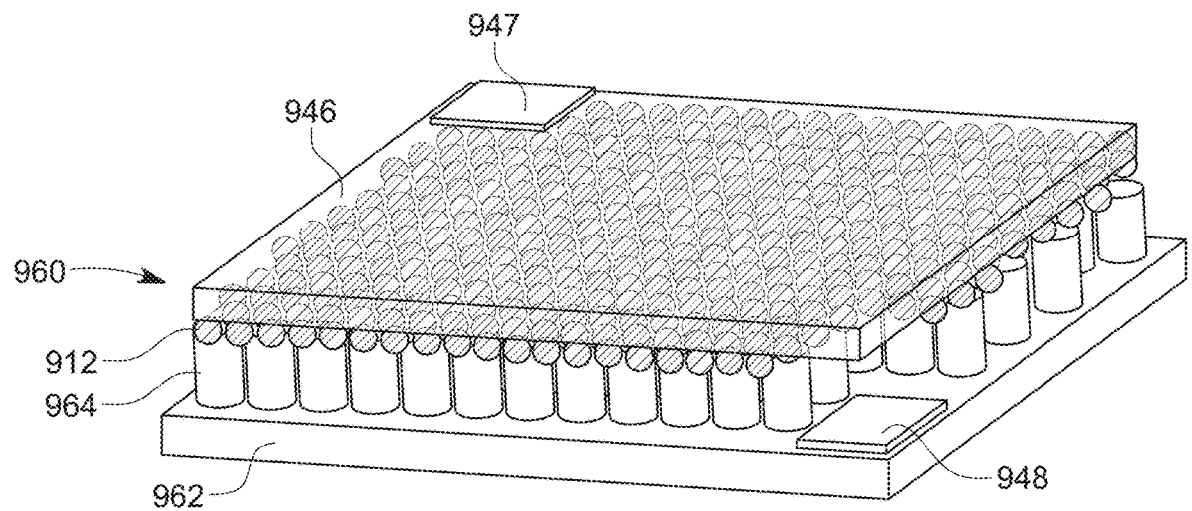

FIGS. 9A to 9C illustrate variations of the device 800 that are configured to work as photodetectors. The photodetector 900 shown in FIG. 9A has a substrate 902 on which the GaN NWs 904 were grown perpendicular to the surface of the substrate. A transparent contact layer 920 is formed on the free end of the GaN NWs 904, as shown in FIG. 9A. A first electrode 930 is formed on the transparent contact layer 920 and a second electrode 932 is formed on the substrate 902.

FIG. 9B illustrates a variation of the above photodetector 900, in which the photodetector 940 includes a substrate 942, which is an n-type UV wide bandgap semiconductor, for example, an epilayer or a layer including quantum wells. A layer 944 of p-type MnO QDs is formed on top the substrate 942 and a contact transparent layer 946 is formed over the layer 944. Electrodes 947 and 948 are formed over the transparent layer 946 and the substrate 942, respectively. FIG. 9C illustrates another photodetector 960 in which the substrate 962 is made of $SiO_2$. An n-type UV wide bandgap semiconductor layer 964 is formed over the substrate and the layer 964 may include plural NWs 904 as in FIG. 9A. P-type MnO QDs 912 are randomly distributed only on the top of the NWs 904, and a transparent contact layer 946 is formed over the MnO QDs 912, as shown in FIG. 9C. Electrodes 947 and 948 are formed over the layers 962 and 946 similar to those in FIG. 9A. Those skilled in the art will understand that other variations of the photodetectors 900, 940, and 960 may be implemented based on the teachings from this application.

Figure 10:
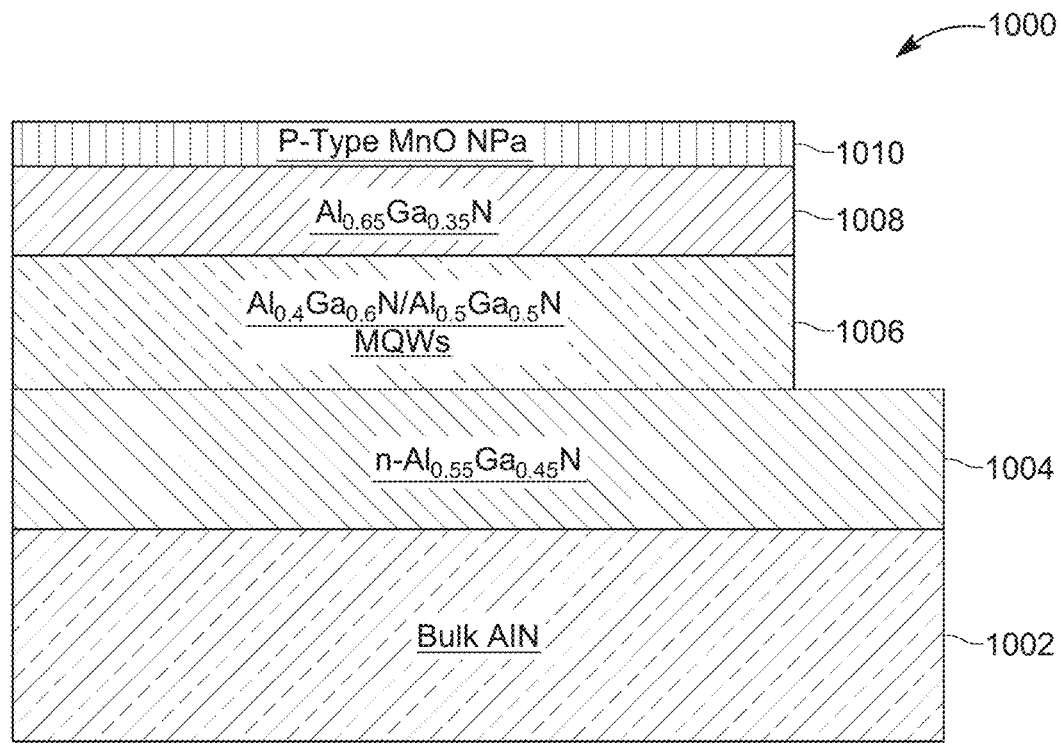
FIG. 10 illustrates an optoelectronic device that uses a p-type layer of MnO quantum dots.

A UV and DUV optoelectronic device 1000 that uses a p-type layer of MnO QDs is now discussed with regard to FIG. 10. As commercial emitting devices, including white LED, DUV (UV-C) LEDs, and laser diodes are based on p-n junctions, the p-type MnO QDs 112 can act as a p-type layer for such devices. The p-type DUV semiconductors need to be configured to not absorb the light coming from the active layer in such devices. For example, Al-rich III-N materials, and AlGaN in particular, are the most suitable for DUV LED operating at 260-275 nm (4.5-4.78 eV). However, obtaining DUV LEDs with a high external quantum efficiency (EQE) remains a significant challenge for the industry and scientific community. The device 1000 of FIG. 10 achieves a high internal efficiency AlGaN (or any wide bandgap semiconductor) DUV LED structure (<280 nm) on AlN substrate 1002, with no TDs and with a high IQE (>83%). FIG. 10 shows the novel DUV LED that uses the MnO QDs based layer 1010 that can be transparent for even UV-C light emitted by the active layer 1006. The active layer 1006 is sandwiched between an n-type contact layer 1004, made for example, of AlGaN having a thickness of 1.8 micrometers, and an AlGaN electron blocking layer 1008 having a thickness of about 30 nm.

An advantage of the MnO QDs layer 1010 is that such a layer does not need to be lattice matched as it can be deposited on the device 1000 by drop-casting, spin coating or spray-coating, which are simple and cost effective methods. In addition, the preparation of the MnO QDs 112 is very cost-effective.

The disclosed embodiments provide a p-type colloidal MnO QDs based optoelectronic device that shows a very good responsivity in the DUV range as well as transparent electronic devices such as high-power devices, e.g., high-electron-mobility transistor (HEMT), that work in a harsh environment based on DUV wide bandgap semiconductor (e.g., AlGaN). It should be understood that this description is not intended to limit the invention. On the contrary, the embodiments are intended to cover alternatives, modifications and equivalents, which are included in the spirit and scope of the invention as defined by the appended claims. Further, in the detailed description of the embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

REFERENCES

[1] Mitra, S., Aravindh A. Das G., Pak Y., Ajia I., Loganathan K. Fabrizio D. E., Rogan S. I., *Nano Energy* 48, 551 (2018).
[2] International Patent Application Publication No. WO 2018/215893, entitled "Method and Apparatus for Fabricating High Performance Optoelectronic Devices," assigned to the assignee of this application.

What is claimed is:

1. A photodetector for detecting deep ultra-violet light, the photodetector comprising:
a substrate;
first and second electrodes separated by a channel; and
colloidal MnO based quantum dots formed in the channel,
wherein the colloidal MnO based quantum dots are sensitive to ultra-violet light having a wavelength lower than 300 nm, and
wherein the colloidal MnO based quantum dots exhibit p-type conduction.

2. The photodetector of claim 1, wherein the colloidal MnO based quantum dots include MnO, MnOOH, and $Mn_2O_3$.

3. The photodetector of claim 1, wherein the colloidal MnO based quantum dots include 81.5% MnO, 12.0% MnOOH, and 6.5% $Mn_2O_3$.

4. The photodetector of claim 1, wherein the colloidal MnO based quantum dots include less than 85% MnO, between 10 and 15% MnOOH, and less than 10% $Mn_2O_3$.

5. The photodetector of claim 1, wherein the first electrode is formed from a material different from a material of the second electrode.

6. An optoelectronic device that operates under deep ultra-violet conditions, the optoelectronic device comprising:
a substrate;
first and second electrodes separated by a channel; and
a heterojunction formed in the channel, between the first and second electrodes,
wherein the heterojunction includes a p-type colloidal MnO based quantum dots and an n-type material based layer.

7. The optoelectronic device of claim 6, wherein the n-type material based layer is a two-dimensional (2D) $MoS_2$ layer.

8. The optoelectronic device of claim 7, wherein the 2D $MoS_2$ layer is coated with the p-type colloidal MnO based quantum dots.

9. The optoelectronic device of claim 6, wherein the colloidal MnO based quantum dots are sensitive to ultra-violet light having a wavelength lower than 300 nm.

10. The optoelectronic device of claim 6, wherein the colloidal MnO based quantum dots include MnO, MnOOH, and $Mn_2O_3$.

11. The optoelectronic device of claim 6, wherein the colloidal MnO based quantum dots include 81.5% MnO, 12.0% MnOOH, and 6.5% $Mn_2O_3$.

12. The optoelectronic device of claim 6, wherein the colloidal MnO based quantum dots include less than 85% MnO, between 10 and 15% MnOOH, and less than 10% $Mn_2O_3$.

13. The optoelectronic device of claim 6, wherein the first electrode is formed from a material different from a material of the second electrode.

14. The optoelectronic device of claim 6, further comprising:
a third electrode formed on the substrate, opposite to the heterojunction so that the optoelectronic device acts as a transistor.

15. An optoelectronic device that operates under deep ultra-violet conditions, the optoelectronic device comprising:
a substrate;
plural nanowires attached with one end to the substrate;
plural p-type colloidal MnO based quantum dots formed on the plural nanowires; and
first and second electrodes.

16. The optoelectronic device of claim 15, further comprising:
a transparent contact layer formed over other ends of the plural nanowires,
wherein the first electrode is formed over the transparent contact layer and the second electrode is formed over the substrate.

17. The optoelectronic device of claim 15, wherein the plural nanowires are made of GaN.

18. The optoelectronic device of claim 15, wherein the colloidal MnO based quantum dots are sensitive to ultra-violet light having a wavelength lower than 300 nm.

19. The optoelectronic device of claim 15, wherein the colloidal MnO based quantum dots include less than 85% MnO, between 10 and 15% MnOOH, and less than 10% $Mn_2O_3$.

20. A photodetector for detecting deep ultra-violet light, the photodetector comprising:
a substrate;
first and second electrodes separated by a channel; and
colloidal MnO based quantum dots formed in the channel,
wherein the colloidal MnO based quantum dots are sensitive to ultra-violet light having a wavelength lower than 300 nm, and
wherein the colloidal MnO based quantum dots include MnO, MnOOH, and $Mn_2O_3$.

* * * * *